United States Patent
Wan et al.

(10) Patent No.: US 8,471,744 B1
(45) Date of Patent: Jun. 25, 2013

(54) REDUCED RESIDUAL OFFSET SIGMA DELTA ANALOG-TO-DIGITAL CONVERTER (ADC) WITH CHOPPER TIMING AT END OF INTEGRATING PHASE BEFORE TRAILING EDGE

(75) Inventors: Ho Ming (Karen) Wan, Hong Kong (HK); Yat To (William) Wong, Hong Kong (HK); Kwai Chi Chan, Hong Kong (HK)

(73) Assignee: Hong Kong Applied Science & Technology Research Institute Company, Ltd., Hong Kong (HK)

( * ) Notice: Subject to any disclaimer, the term of this patent is extended or adjusted under 35 U.S.C. 154(b) by 4 days.

(21) Appl. No.: 13/308,737

(22) Filed: Dec. 1, 2011

(51) Int. Cl.
*H03M 3/00* (2006.01)

(52) U.S. Cl.
USPC ............................ 341/143; 341/155; 341/172

(58) Field of Classification Search
USPC .......................................... 341/143, 155, 172
See application file for complete search history.

(56) References Cited

U.S. PATENT DOCUMENTS

| | | | |
|---|---|---|---|
| 4,939,516 A * | 7/1990 | Early | 341/143 |
| 5,148,167 A | 9/1992 | Ribner | |
| 5,477,481 A | 12/1995 | Kerth | |
| 7,038,532 B1 * | 5/2006 | Bocko et al. | 327/554 |
| 7,170,338 B1 * | 1/2007 | Tucker | 330/9 |
| 7,250,886 B1 * | 7/2007 | Killat et al. | 341/143 |
| 7,812,757 B1 | 10/2010 | Wong et al. | |
| 2010/0289682 A1 | 11/2010 | Groenewold | |

* cited by examiner

*Primary Examiner* — Jean B Jeanglaude
(74) *Attorney, Agent, or Firm* — Stuart T. Auvinen; gPatent LLC (57) ABSTRACT

An analog-to-digital converter (ADC) has a chopper-stabilized sigma-delta modulator (SDM). The SDM uses switched-capacitor integrators to sample, hold, and integrate an analog input in response to non-overlapping multi-phase clocks. Chopper multipliers are inserted on the inputs and outputs of an op amp in a first stage integrator. The chopper multipliers swap or pass through differential inputs in response to non-overlapping chopper clocks. A master clock operating at a frequency of the multi-phase clocks is divided down to trigger generation of the chopper clocks. Delay lines ensure that the edges of the chopper clocks occur before the edges of the multi-phase clocks. The chopper multipliers have already switched and are thus stable when multi-phase clocks change so charge injection at switches controlled by the multi-phase clocks is not immediately modulated by chopper multipliers. This clock timing increases the time available to respond to charge injection at switches improving linearity.

20 Claims, 9 Drawing Sheets

PRIOR ART

P2 TRIGGERS CHOPPER CLKS

P1: SAMPLE PHASE, C1=1

FIG. 7

P2: INTEGRATE PHASE, C1=1

REDUCED RESIDUAL OFFSET SIGMA DELTA ANALOG-TO-DIGITAL CONVERTER (ADC) WITH CHOPPER TIMING AT END OF INTEGRATING PHASE BEFORE TRAILING EDGE

FIELD OF THE INVENTION

This invention relates to sigma-delta modulators, and more particularly for clock-timing improvements for chopper stabilization of amplifiers.

BACKGROUND OF THE INVENTION

Sigma-delta modulators are widely used in consumer audio and precision measurement devices, such as 24-bit audio analog-to-digital converters (ADC). Signal processing is performed in the digital domain rather than in the analog domain, allowing for power savings and performance improvements as semiconductor processes improve. The sigma-delta modulator samples the input signal at a much higher frequency and spreads noise over a wider frequency band. Such over-sampling and noise shaping can provide higher levels of linearity and dynamic range.

Chopper stabilization is sometimes used to shift the noise to a higher frequency, and then to remove the noise after amplification. One multiplier is inserted before the input of the first-stage amplifier, while a second multiplier is inserted at the output of the first-stage amplifier. The multipliers are controlled by a chopping clock. The input signal is shifted to odd harmonics of the chopping clock by the first multiplier. Unwanted noise at the amplifier input remains at a low frequency. After the noise and harmonics are amplified, the second multiplier shifts the signal from the odd harmonics back to the lower frequency band, and at the same time shifts the amplified low-frequency noise up to the harmonics where it can be filtered out. The signal at the lower frequency band is thus removed of the unwanted noise.

Figure 1:
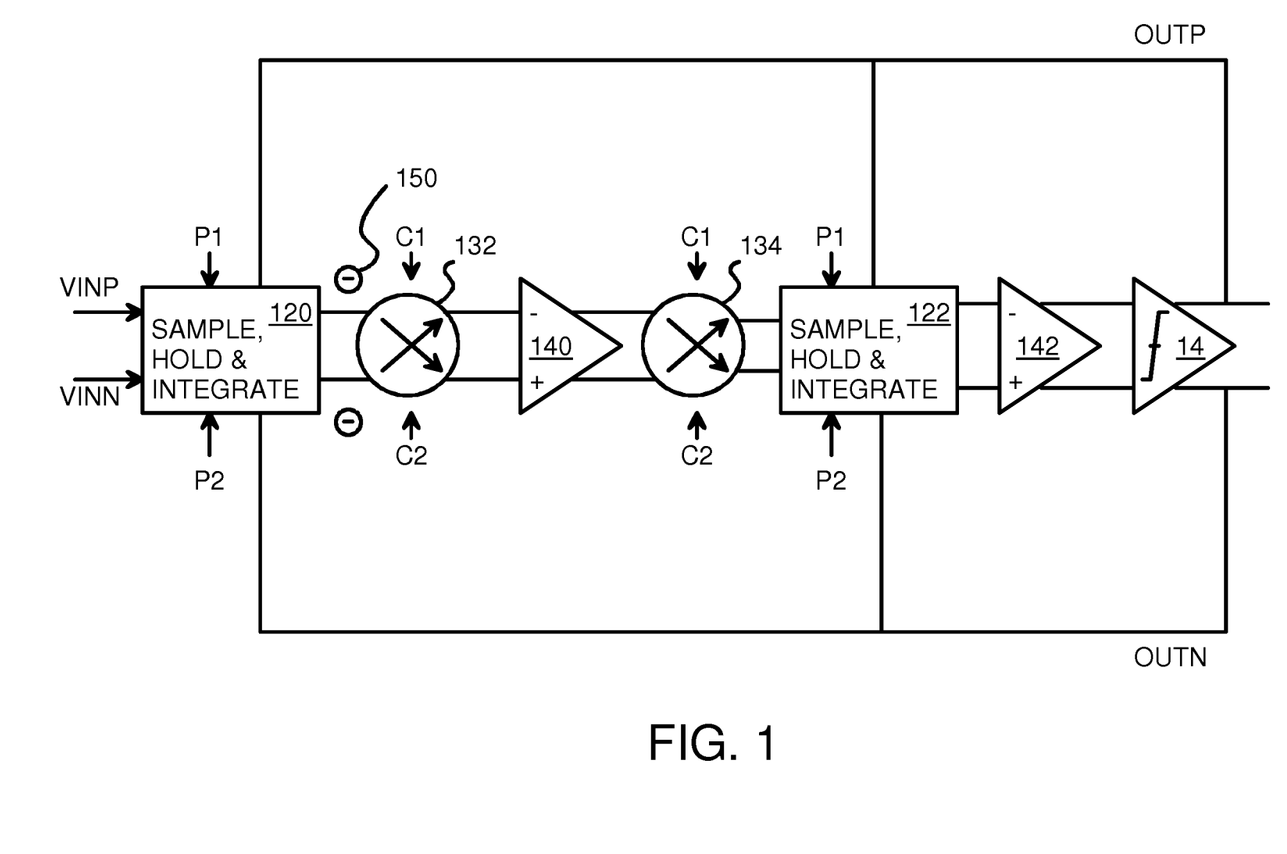
FIG. 1 is a diagram of a chopper-stabilized sigma-delta modulator.

FIG. 1 is a diagram of a chopper-stabilized sigma-delta modulator. FIG. 1 represents a block diagram of a system desired by the inventors, rather than representing any prior art per se. A differential input signal VINP, VINN represents an analog signal and is input to sample, hold, and integrate block 120. Non-overlapping phase clocks P1, P2 control switches within sample, hold, and integrate block 120 to connect the analog input VINP, VINN to sampling capacitors during P1, and to disconnect the analog input and apply feedback to the sampling capacitors during P2. The sampling capacitors drive the output of sample, hold, and integrate block 120 during P2 but are isolated from the output during P1. P1 is the sample phase while P2 is the integrate phase.

First-stage amplifier 140 is stabilized by the addition of input chopper 132 and output chopper 134. Choppers 132, 134 swap the differential signals when chopper clock C2 is active, but pass through the differential signals when C1 is active. Chopper clocks C1, C2 are non-overlapping and operate at a lower frequency than phase clocks P1, P2.

Integrating capacitors (not shown) may be added around input chopper 132, first-stage amplifier 140, and output chopper 134. A second stage of sample, hold, and integrate block 122 and second-stage amplifier 142 operate in a similar way, but without choppers around second-stage amplifier 142. Quantizer 14 is a 1-bit quantizer, differentiator, delta function, comparator, or single-bit digital-to-analog converter (DAC) that generates differential output OUTP, OUTN, which are also fed back to sample, hold, and integrate blocks 120, 122.

For better linearity in a high-resolution sigma-delta modulator ADC, switches in sample, hold, and integrate block 120 may need a larger on-resistance Ron. A larger Ron is achieved by using slightly larger transistors for the switches. However, these larger transistors also have a larger capacitance and thus have more charge under their channels when turned on. When the transistor switches turn off, some of this charge is pushed to the source and the drain nodes. The larger Ron requires a larger gate size and thus more charge is pushed to the source and drain nodes.

Injected charges 150 are such unwanted charges that are pushed to the source and drain nodes when transistor switches within sample, hold, and integrate block 120 are switched off, such as at the end of P1 or P2. These injected charges 150 pass through input chopper 132 producing voltage spikes on the inputs of first-stage amplifier 140. These voltage spikes are then amplified by first-stage amplifier 140, resulting in error-producing offsets that can feed back and propagate through second-stage amplifier 142 to the outputs.

Injected charges 150 may be injected just before chopper clocks C1, C2 switch, causing errors in chopper stabilization. Spurs may be added to the signal band when charge injection occurs at a critical time just before chopper clocks switch.

Figure 2:
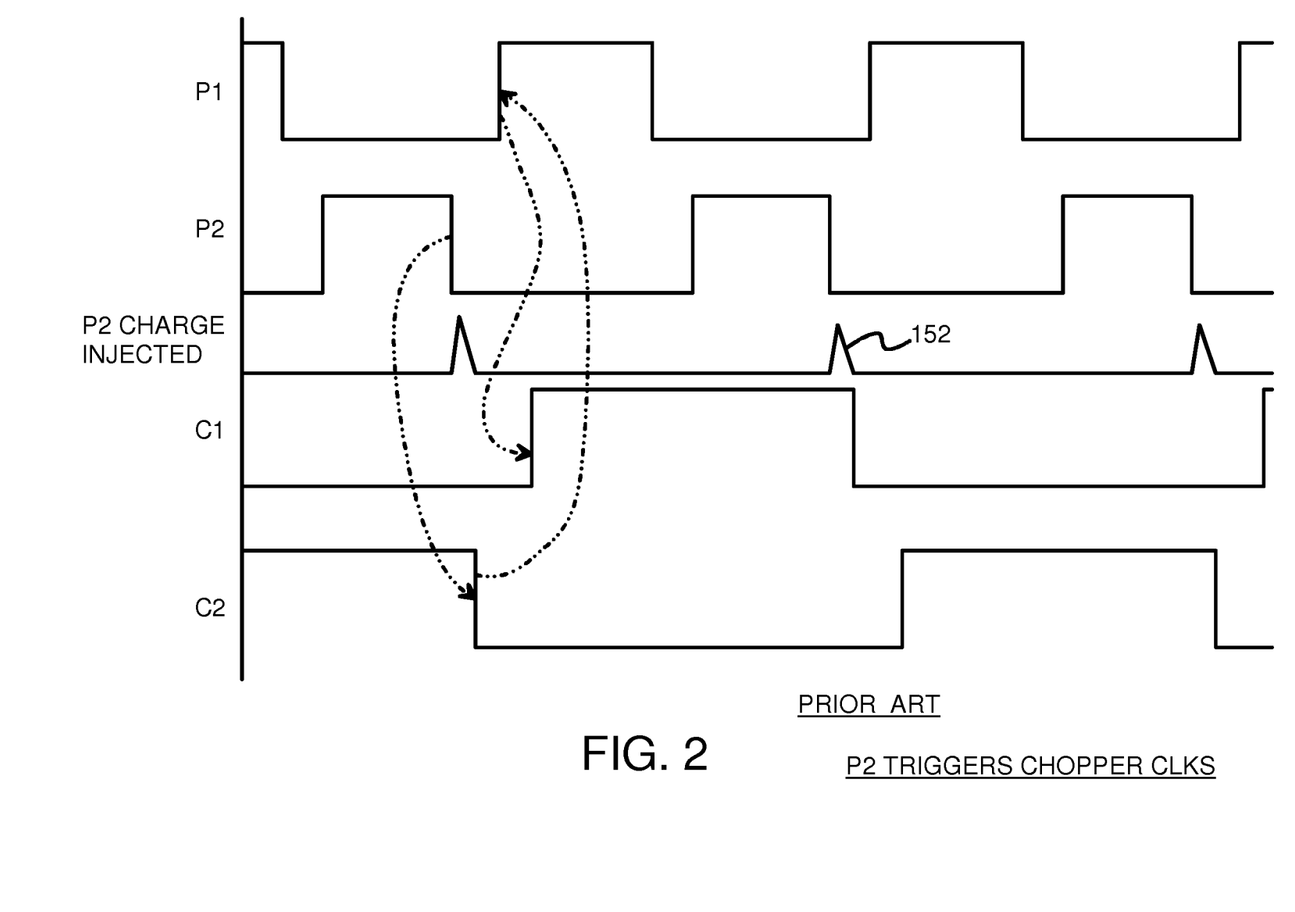
FIG. 2 shows a traditional chopper clock timing that causes voltage spikes as P2 clocks are turned off just before chopper clocks are switched.

FIG. 2 shows a traditional chopper clock timing that causes voltage spikes as P2 clocks are turned off just before chopper clocks are switched. Phase clocks P1, P2 are non-overlapping and control sampling and integration in sample, hold, and integrate block 120 (FIG. 1). Chopper clocks C1, C2 are also non-overlapping but operate at a divided-down frequency, such as one-half or one-fourth the frequency of phase clocks P1, P2.

In the traditional timing, P2 falling causes chopper clock C2 to fall. P1 rising causes C1 to rise after some propagation delay. Voltage spikes 152 occur on the transistor switches in sample, hold, and integrate block 120 as P2 falls. These voltage spikes 152 occur after P2 falls, but before C2 falls, when C2 is still active. Thus the injected charge is passed through the transistors that are open during C2 in input chopper 132. Additional charge (not shown) is then injected on these same nodes as C2 falls. Thus voltage spikes 152 are modulated and demodulated by input chopper 132 and output chopper 134, resulting in errors that are not cancelled out.

Figure 3:
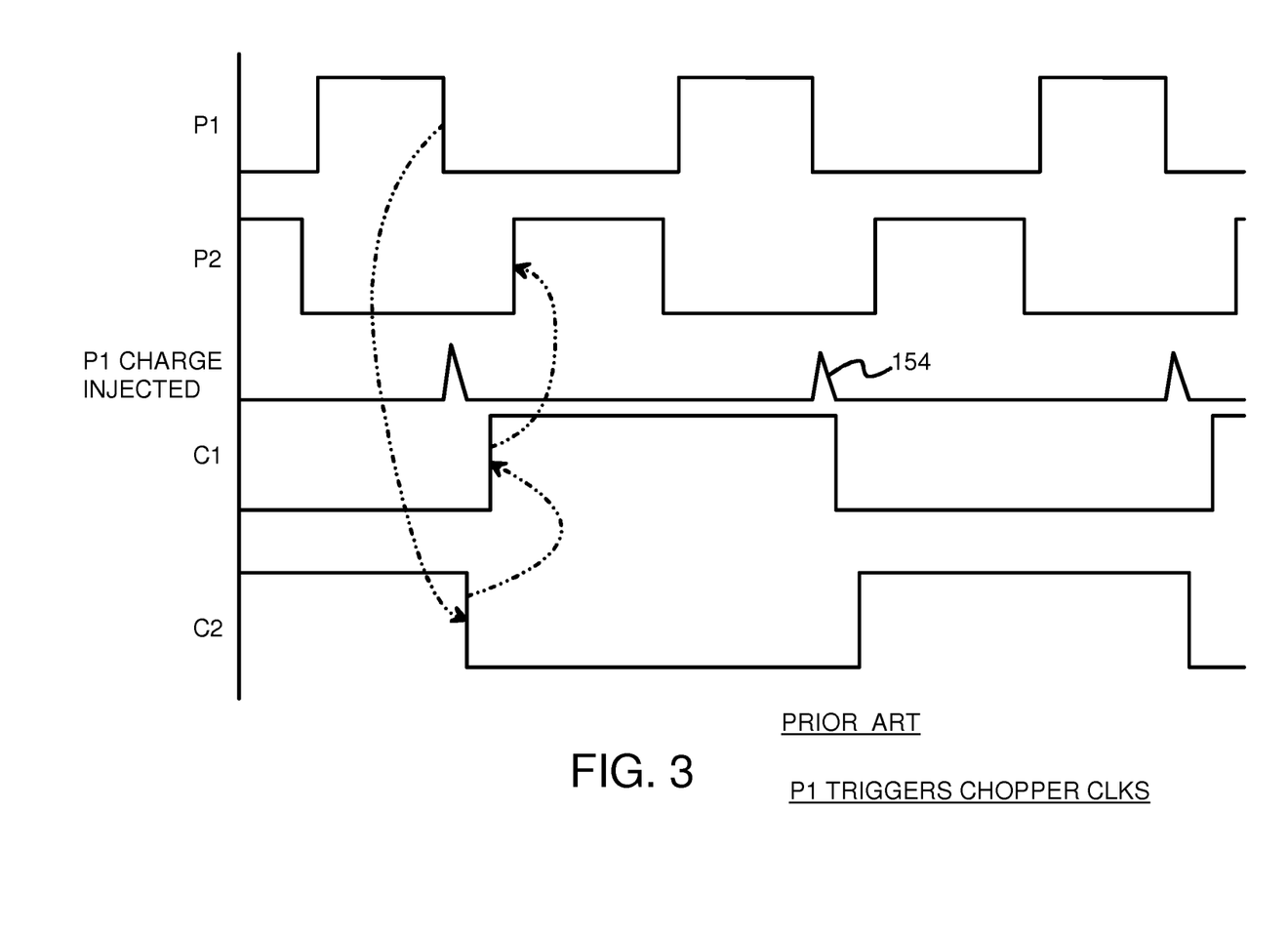
FIG. 3 shows another prior-art chopper clock timing that causes voltage spikes as P1 clocks are turned off just before chopper clocks are switched.

FIG. 3 shows another prior-art chopper clock timing that causes voltage spikes as P1 clocks are turned off just before chopper clocks are switched. See for example U.S. Pub. No. 2010/0289682 by Groeneold, FIG. 4.

In this prior-art timing, P1 falling causes chopper clock C2 to fall. Then the other chopper clock C1 rises. Finally P2 rises. Chopper clocks C1, C2 change during non-active periods when both P1 and P2 are low.

Voltage spikes 154 occur on the transistor switches in sample, hold, and integrate block 120 as P1 falls. These voltage spikes 154 occur after P1 falls, but before C2 falls, when C2 is still active. Thus the injected charge is passed through the transistors that are open during C2 in input chopper 132. Voltage spikes 154 are modulated and demodulated by input chopper 132 and output chopper 134, resulting in errors that are not cancelled out. Also, additional charge (not shown) is then injected on the outputs by transistors in output chopper 134 as C2 falls.

In both FIG. 2 and FIG. 3, voltage spikes occur when the leading phase clock falls, as charge is injected by the transistor switches closing. These voltage spikes occur at a critical time just before the chopper clocks switch. Thus the voltage spikes are modulated and demodulated along with the input signal at this critical time.

What is desired is a sigma-delta modulator with and improved chopper-clock timing. A switched-capacitor integrator sigma-delta modulator is desired than does not inject charge just before chopper clocks toggle. A sigma-delta modulator with improved linearity and noise margins is desired.

DETAILED DESCRIPTION

The present invention relates to an improvement in chopper-stabilized sigma-delta modulators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the prior-art chopper-clock timing is undesirable since charge is injected by the phase clock turning off just before the chopper clocks change. The injected charge occurs at a critical time when node voltages should be stable. The inventors further realize that chopper clock timing can be changed so that charge from the phase clocks is injected after the chopper clocks have changed, after the critical time has passed. Then the circuit has a longer time to recover from the injected charge.

Figure 4:
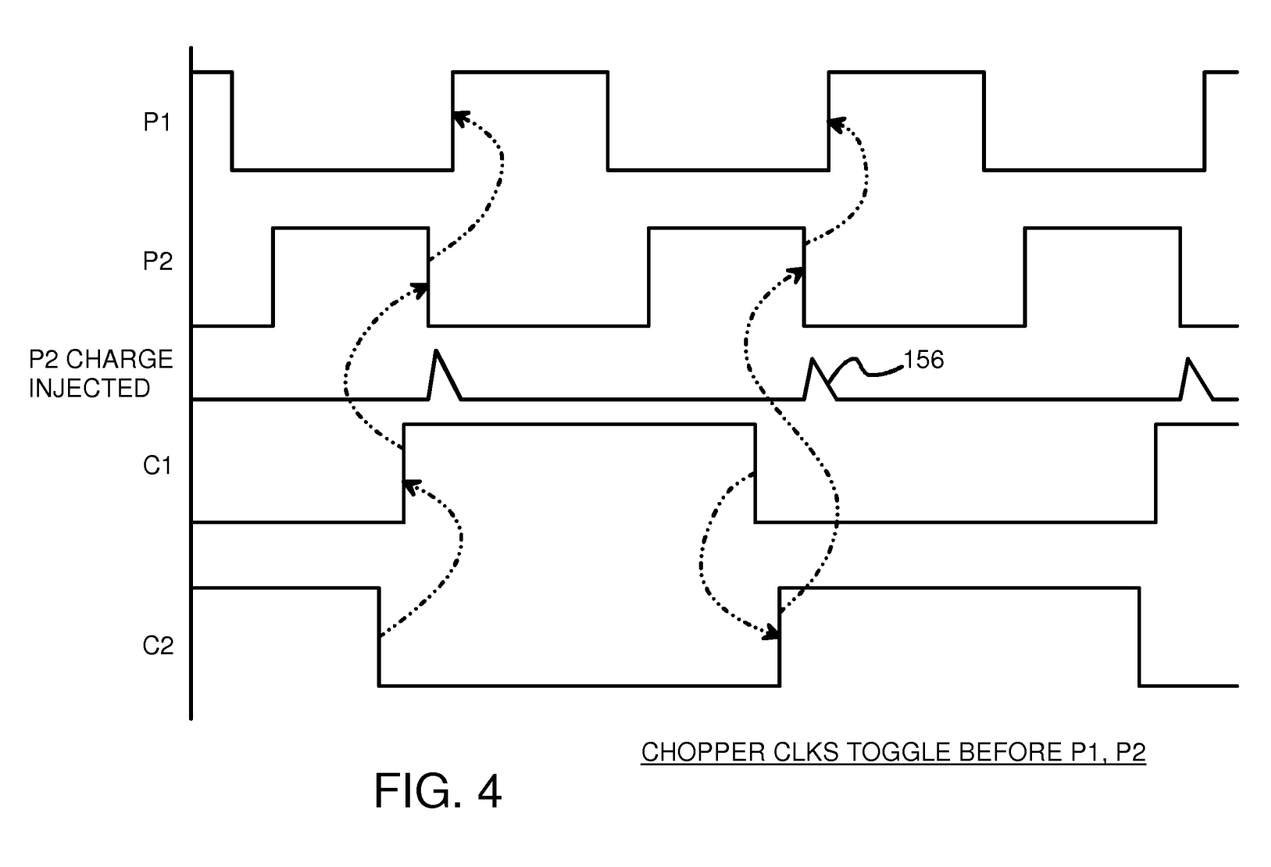
FIG. 4 shows an improved timing where the chopper clocks change before the phase clocks.

FIG. 4 shows an improved timing where the chopper clocks change before the phase clocks. Since the chopper clocks are divided-down from the phase clocks, it is counter-intuitive to generate the faster clocks from the slower clocks. However, such a counter-intuitive timing produces benefits for a chopper-based sigma-delta modulator.

In an actual circuit, the chopper clocks may be divided down from the phase clocks by a divisor of 2 or more, such as 2, 4, 16, 32, 64, etc. Although chopper clocks C1, C2 operate at a lower frequency than phase clocks P1, P2, chopper clocks C1, C2 toggle before phase clocks P1, P2 change. The edges of the chopper clocks occur before the edges of the phase clocks when both the chopper and phase clocks change.

While P2 is still active, chopper clock C2 falls and then chopper clock C1 rises. After C1 rises, phase clock P2 falls, causing charge injection and voltage spikes 156. However, chopper clocks C1, C2 are stable when voltage spikes 156 occur, allowing for stabilization of nodes to occur before the next change of phase clocks P1, P2. Indeed, since P1 rises just after voltage spikes 156 are generated by P2 falling, some of the injected charge may be absorbed by the transistor switches controlled by P1 rising, rather than being propagated through input chopper 132 to first-stage amplifier 140. Some of the injected charge may be diverted to the newly-formed channels as P1 rises. In any case, there is a longer time for the charge sharing to settle before the next phase clock change. Enough time is available for integration to settle and for first-stage amplifier 140 to operate and drive its outputs to a stable value. Better linearity should be achieved.

When chopper clock C1 falls, C2 rises slightly later, but before P2 falls and P1 rises. Other edges of phase clocks P1, P2 are generated when chopper clocks C1, C2 do not toggle. A master clock running at the frequency of phase clocks P1, P2 can be used to generate all clocks P1, P2, C1, C2 with desired timing by re-synchronizing the divided-down clock to the master clock, and then using controlled delays to generate the clock edges in the desired sequence, as shown later in FIG. 8.

Figure 5:
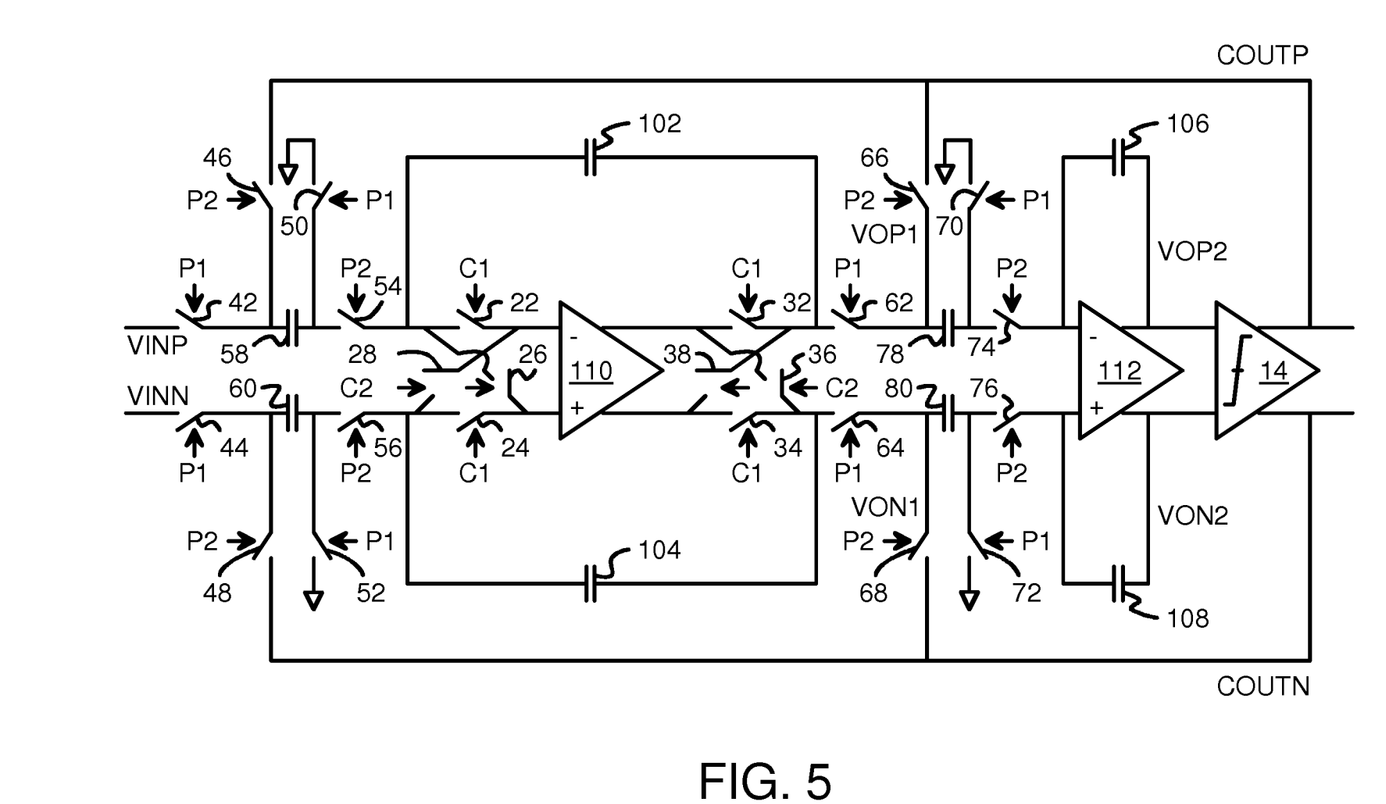
FIG. 5 is a schematic of switched-capacitor integrators that implement a chopper-stabilized sigma-delta modulator.

FIG. 5 is a schematic of switched-capacitor integrators that implement a chopper-stabilized sigma-delta modulator. The timing of chopper clocks C1, C2 and phase clocks P1, P2 that is shown in FIG. 4 is applied as clocks C1, C2, P1, P2 in FIGS. 5-7. In particular, chopper clocks C1, C2 toggle before phase clocks P1, P2 during the times that both chopper and phase clocks change. Since phase clocks P1, P2 operate at a higher frequency that chopper clocks C1, C2, there are times when phase clocks P1, P2 toggle but chopper clocks C1, C2 remain stable.

A differential input signal VINP, VINN is applied to switches 42, 44, which are closed in phase P1 to charge capacitors 58, 60. Switches 50, 52 also close during P1 to ground the back plate of capacitors 58, 60.

During phase P2, switches 42, 44, 50, 52 open and switches 54, 56 close to pass the charge stored on capacitors 58, 60 to the inputs of op amp 110. Non-overlapping chopper clocks C1, C2 are applied to switches 22, 24, 26, 28 to either pass through or reverse the signals applied to inverting and non-inverting inputs of op amp 110. Similar chopper switches 32, 34, 36, 38 are on the outputs of op amp 110. Feedback capacitors 102, 104 connect the inputs and outputs of op amp 110 for a configuration with a gain of k1, where k1 is the ratio of capacitor 58 and capacitor 102.

A second sample, hold, and integrate block is coupled to the output of op amp 110 by switches 62, 64, which are also closed during phase P1, and by capacitors 78, 80. Grounding switches 70, 72 are closed during P1. During phase P2, switches 62, 64, 70, 72 open and switches 74, 76 close to pass the charge stored on capacitors 78, 80 to the inputs of second op amp 112. Feedback capacitors 106, 108 connect the inputs and outputs of second op amp 112 for a configuration with a gain of k2, where k2 is the ratio of capacitor 78 and capacitor 106.

Quantizer 14 receives the outputs VOP2, VON2 of second op amp 112 and generates differential output COUTP, COUTN. Once the difference between VOP2 and VON2 reaches a threshold, quantizer 14 toggles COUTP, COUTN, driving one high and the other low.

COUTP, COUTN may be output to a filter or to other downstream circuits. COUTP, COUTN are also fed back to switches 46, 48 for the first sample, hold, and integrate block, and to switches 66, 68 for the second sample, hold, and integrate block.

Op amp 110 and surrounding components act as a first integrator, such as sample, hold, and integrate block 120 of FIG. 1, while op amp 112 and its surrounding components act as a second integrator, such as sample, hold, and integrate block 122. Summing of feedback signals is provided by switches 46, 48 to capacitors 58, 60, acting as a first summer, and by switches 66, 68 to capacitors 78, 80, acting as a second summer.

Switches 22, 24, 26, 28 implement input chopper 132, while switches 32, 34, 36, 38 implement output chopper 134. These and other switches may be implemented as n-channel transistors, or alternately as p-channel transistors, or transmission gates with both a n-channel and a p-channel transistor in parallel. Scaling may be provided by the capacitor ratios.

Figure 6:
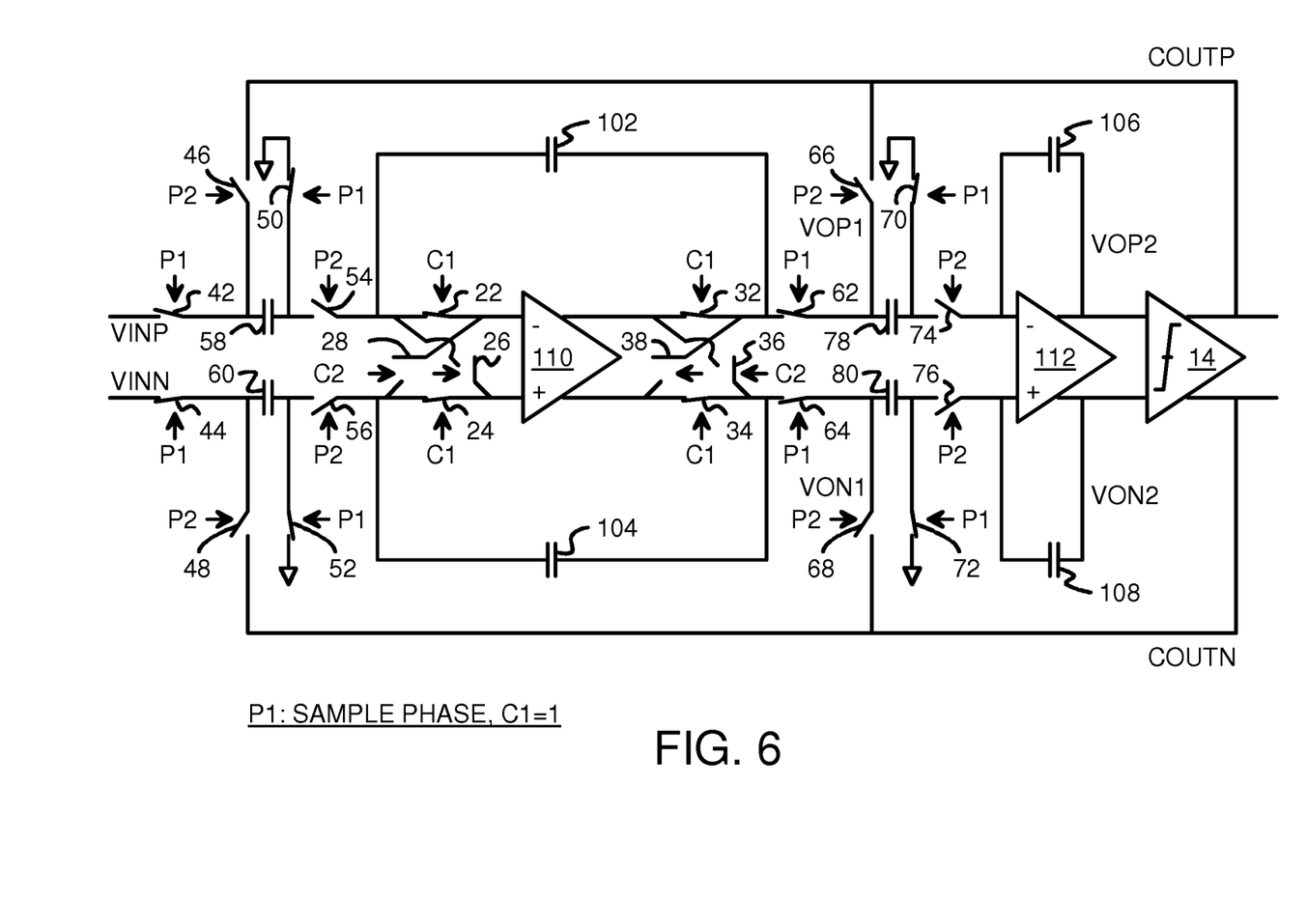
FIG. 6 shows a schematic of the chopper-stabilized sigma-delta modulator during sampling phase P1.

FIG. 6 shows a schematic of the chopper-stabilized sigma-delta modulator during sampling phase P1. When P1 is high and P2 is low, switches 42, 44, 50, 52 close and switches 46, 48, 54, 56 remain open to allow sampling capacitors 58, 60 to sample the analog input. In the second integrator, switches 62, 64, 70, 72 close and switches 66, 68, 74, 76 remain open to allow sampling capacitors 78, 80 to sample the output of the first integrator.

The choppers may be in either state, since the chopper clock is divided-down from the phase clock, but in this example C1 is high and C2 is low. Switches 22, 24, controlled by C1, pass through the feedback from integrating capacitors 102, 104 to the inputs of op amp 110, while switches 26, 28, controlled by C2, remain open to prevent cross-over. In the output chopper, switches 32, 34, controlled by C1, pass through the outputs of op amp 110 to the second stage and to integrating capacitors 102, 104, while switches 36, 38, controlled by C2, remain open to prevent cross-over.

When P2 turned off, just before P1 turned on, chopper clocks C1, C2 were stable, so there is the entire pulse-width of P1 to share the injected charge before the sampling phase ended. The noise from turning P2 off is not modulated and demodulated by input chopper 132 and output chopper 134, since the chopper clocks do not change when charge injection occurs.

Figure 7:
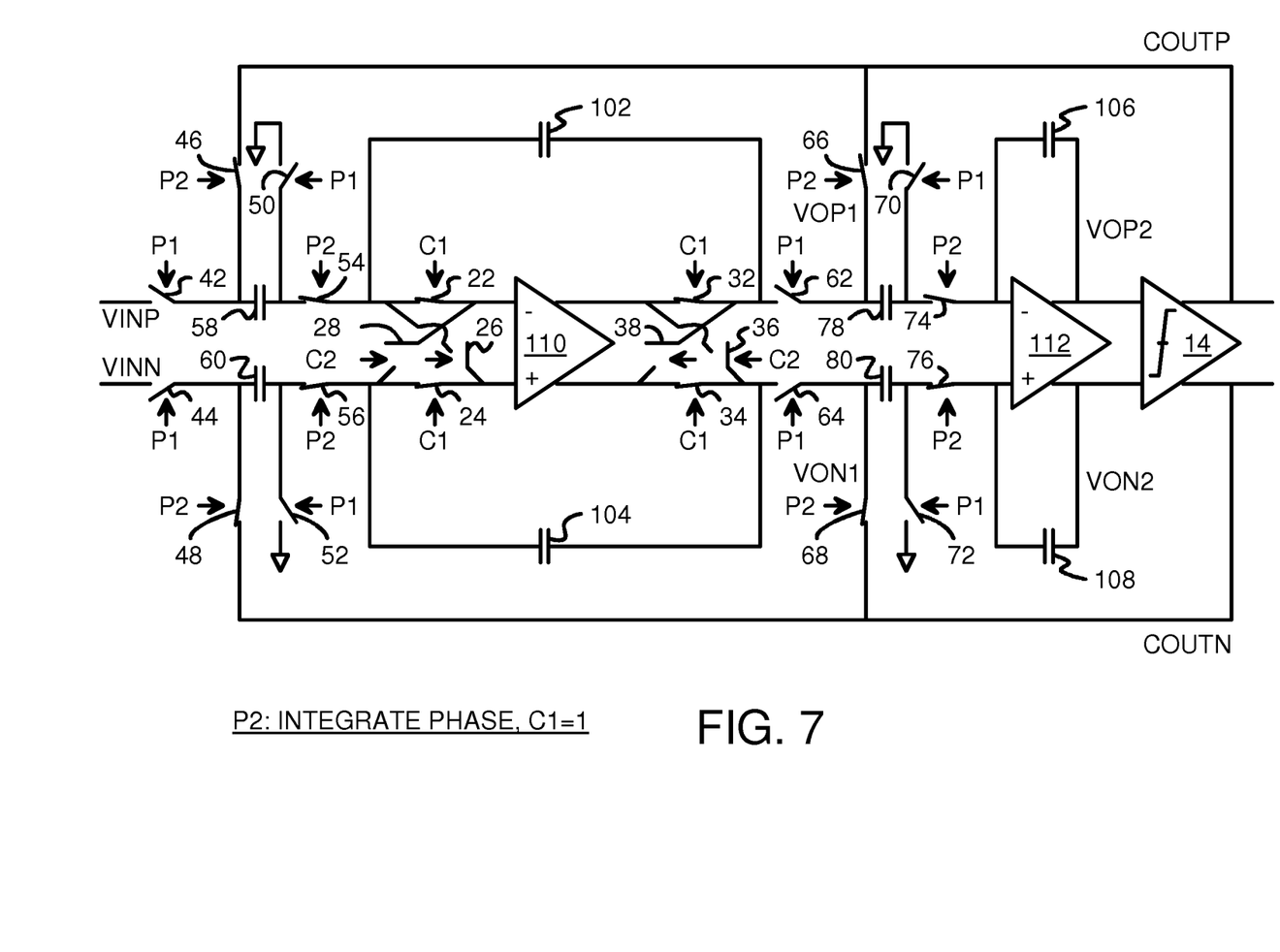
FIG. 7 shows a schematic of the chopper-stabilized sigma-delta modulator during integrating phase P2.

FIG. 7 shows a schematic of the chopper-stabilized sigma-delta modulator during integrating phase P2. When P1 is low and P2 is high, switches 42, 44, 50, 52 remain open and switches 46, 48, 54, 56 close. Feedback is driven to one plate of sampling capacitors 58, 60, while the other plate is connected to the inputs of op amp 110 through switches 54, 56 and the input chopper (switches 22, 24, 26, 28).

In the second integrator, switches 62, 64, 70, 72 are open and switches 66, 68, 74, 76 close. Feedback is driven to one plate of sampling capacitors 78, 80, while the other plate is connected to the inputs of op amp 111 through switches 74, 76.

When P1 turned off, just before P2 turned on, chopper clocks C1, C2 were stable, so there is the entire pulse-width of P2 to share the injected charge before the integrating phase ended. The noise from turning P1 off is not modulated and demodulated by input chopper 132 and output chopper 134, since the chopper clocks do not change when charge injection occurs. Linearity is improved.

Figure 8:
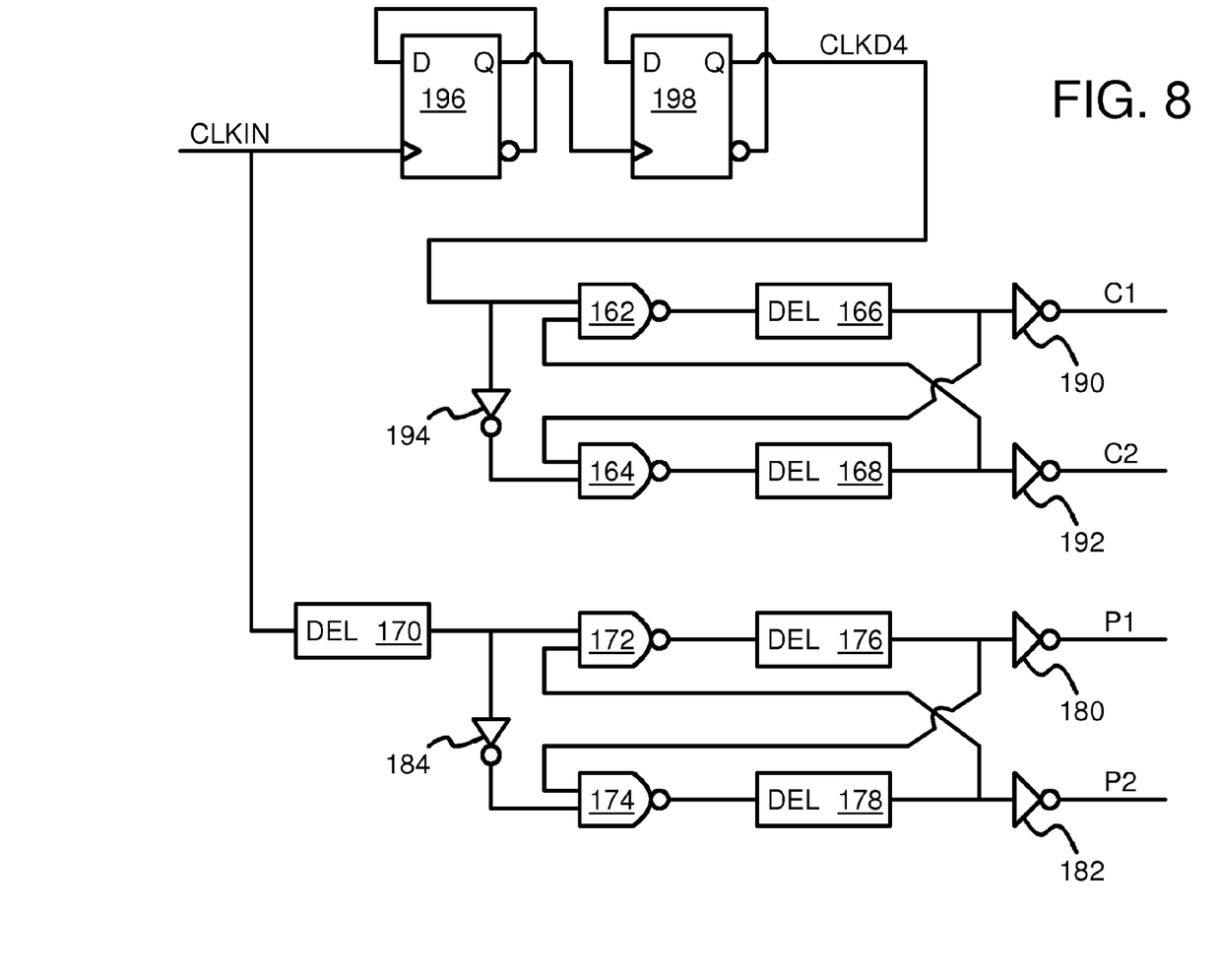
FIG. 8 is a diagram of a clock generator that toggles the chopper clocks before the phase clocks, even though the chopper clock is divided-down from the phase clock.

FIG. 8 is a diagram of a clock generator that toggles the chopper clocks before the phase clocks, even though the chopper clock is divided-down from the phase clock. A master clock CLKIN operates at the frequency of phase clocks P1, P2. Flip-flops 196, 198 divide CLKIN by 4 to generate CLKD4. The timing of FIG. 4 would require only one of flip-flops 196, 198, since in FIG. 4 the chopper clock is only half the frequency of the phase clock.

Inverter 194 inverts CLKD4 and drives a zero to the input of NAND gate 164 when CLKD4 goes high, driving a 1 which is propagated through delay line 168 and inverted by inverter 192 to drive chopper clock C2 low. Then the high output by delay line 168 is fed back to an input of NAND gate 162, allowing the high CLKD4 to be inverted, propagated through delay line 166, inverted by inverter 190, and drive chopper clock C1 high. Thus C1 and C2 are non-overlapping.

Delay line 170 ensures that phase clocks P1, P2 change after chopper clocks C1, C2 change. The amount of delay in delay line 170, and in other components, may be set by a circuit designer to ensure that the timing of FIG. 4 is achieved. In particular, the clock-to-output delay of flip-flop 198 should be less than the delay to generate CLKIN, plus the delay through delay line 170, to ensure that chopper clocks C1, C2 finish toggling before phase clocks P1, P2 toggle.

Inverter 184 inverts the delayed CLKIN from delay line 170 and drives a zero to the input of NAND gate 174 when CLKIN goes high, driving a 1 which is propagated through delay line 178 and inverted by inverter 182 to drive phase clock P2 low. Then the high output by delay line 178 is fed back to an input of NAND gate 172, allowing the high delayed CLKIN to be inverted, propagated through delay line 176, inverted by inverter 180, and drive phase clock P1 high. Thus P1 and P2 are non-overlapping.

Figure 9:
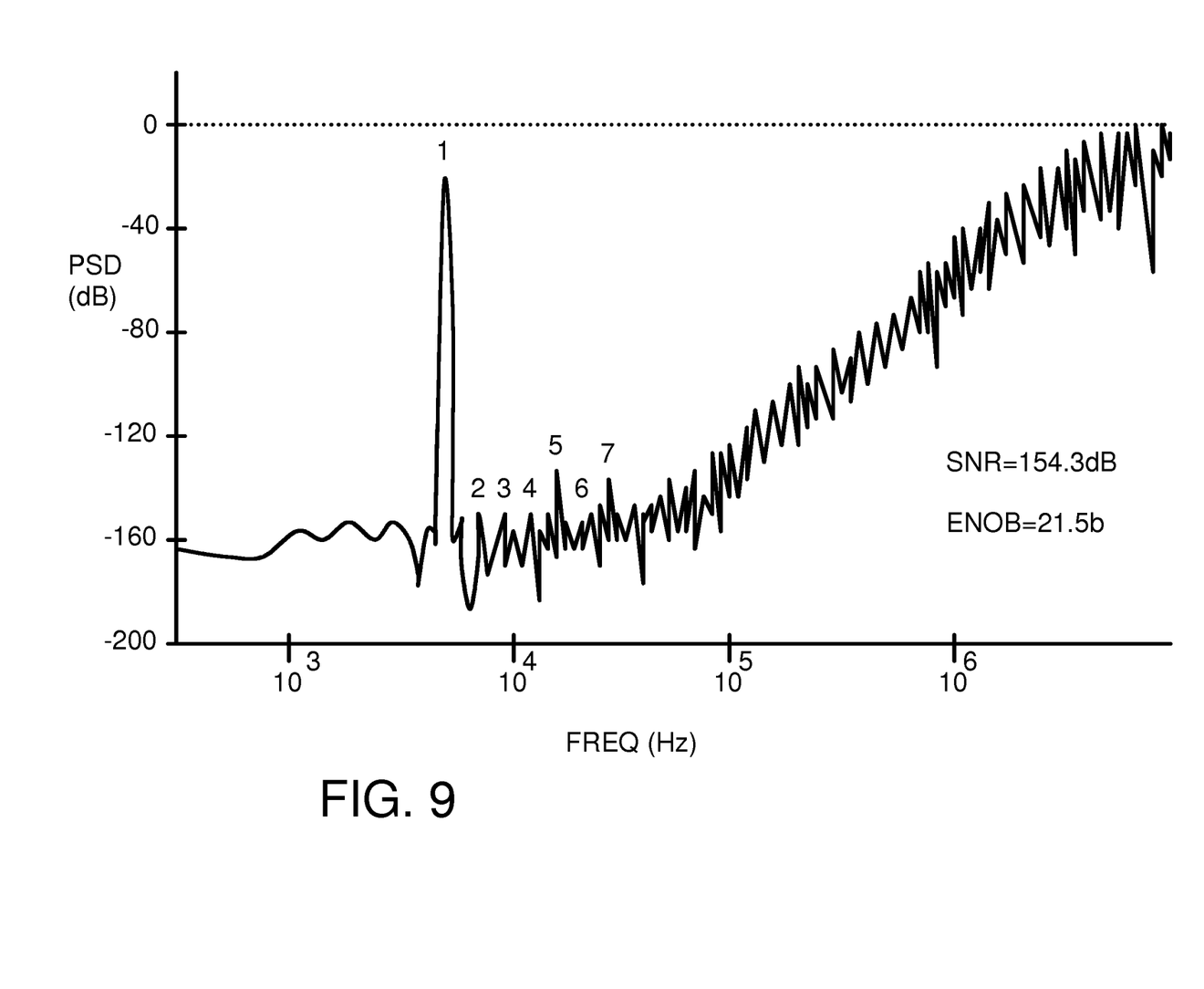
FIG. 9 is a plot of signal performance of the chopper-stabilized sigma-delta modulator.

FIG. 9 is a plot of signal performance of the chopper-stabilized sigma-delta modulator. The circuit of FIG. 5 is operated using the phase and chopper clock timing of FIG. 4. Peaks occur at the fundamental frequency and at odd harmonics. However, the Power-Spectral Density (PSD) remains low to about 50,000 Hz, indicating a good signal-to-noise ratio. The Signal-to-Noise and Distortion Ratio (SNDR) is 154.3 dB and the Equivalent Number of Bits (ENOB) of resolution is 21.5 bits. In comparison, a simulation using the timing of FIG. 2 produced an ENOB of 20.4, while a simulation using the timing of FIG. 3 produced an ENOB of 19.1. Thus the improved timing improves the equivalent resolution by 1 to 2 bits.

Alternate Embodiments

Several other embodiments are contemplated by the inventors. For example the clock generator may be implemented in a variety of ways, such as one or more Phase-Locked Loops (PLL's), delay lines, other kinds of clock dividers, toggle flip-flops, latches, and other arrangements and kinds of logic gates. While feedback to NAND gates has been shown in FIG. 8 for generating non-overlapping clocks, careful timing analysis could allow delay lines to create the non-overlapping clocks without feedback.

The phase clocks may also be called multi-phase clocks. The master clock could operate at another frequency that is divided down by a first divisor to trigger generation of the phase clocks, and divided down by a larger divisor to trigger generation of the chopper clocks.

Latches, flip-flops, registers, and other storage devices may be inserted in the logic and data paths to allow for synchronization to clocks for timing and pipelining purposes. Buffers, capacitors, filters, resistors, and other components may also be added for various purposes. Rather than have phase switches 50, 52, 70, 72 apply ground to the back terminal of the sampling capacitors, another fixed voltage such as power or a common-mode voltage could be applied.

Inversions may be added by swapping inverting and non-inverting inputs as desired, but do not change the overall function and thus may be considered equivalents. Switches could be n-channel transistors, p-channel transistors, or transmission gates with parallel n-channel and p-channel transistors, or more complex circuits, either passive or active, amplifying or non-amplifying. Clocks may be inverted to drive the gates of p-channel transistors. Active-low clocks could be used that have non-overlapping low-going pulses rather than non-overlapping high-going pulses.

Additional components may be added at various nodes, such as resistors, capacitors, inductors, transistors, etc., and parasitic components may also be present. Enabling and disabling the circuit or powering down blocks could be accomplished with additional transistors or in other ways. Pass-gate transistors or transmission gates could be added for isolation. While differential logic has been shown, single-ended signals could be used with a fixed voltage such as ground for the complement differential signals, or just the true differential path could be used.

The final sizes of transistors and capacitors may be selected after circuit simulation or field testing. Metal-mask options or other programmable components may be used to select the final capacitor, resistor, or transistor sizes. Equalizing switches could be added between differential signals.

Summers may add positive or negative values. When a negative value is added, the summer may be considered to be a subtractor. The term "summer" is intended to include both adders and subtractors. While chopper multipliers have been added to a first stage in a two-stage sigma-delta modulator, chopper multipliers could be added to the second stage rather than to the first stage, or to both stages. While a two-stage sigma-delta modulator has been shown, a single-stage sigma-delta modulator could be used, or a three-stage sigma-delta modulator.

While an application of the sigma-delta modulator in an ADC has been described, the sigma-delta modulator could be used in other applications.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A chopper-stabilized sigma-delta modulator comprising:

an analog input;

a first sample, hold, and integrate block that receives the analog input and receives a differential feedback signal, the first sample, hold, and integrate block having a first sampling capacitor and first phase switches and a first differential output;

a first op amp having a first op amp differential input and a first op amp differential output;

a first chopper multiplier, coupled between the first differential output and the first op amp differential input, the first chopper multiplier passing the first differential output through to the first op amp differential input in response to a first chopper clock, the first chopper multiplier swapping differential signals from the first differential output to drive the first op amp differential input in response to a second chopper clock;

a second chopper multiplier, coupled between the first op amp differential output and an intermediate differential signal, the second chopper multiplier passing the first op amp differential output through to the intermediate differential signal in response to the second chopper clock, the second chopper multiplier swapping differential signals from the first op amp differential output to drive the intermediate differential signal in response to the second chopper clock;

a second sample, hold, and integrate block that receives the intermediate differential signal and receives the differential feedback signal, the second sample, hold, and integrate block having a second sampling capacitor and second phase switches and a second differential output;

a second op amp receiving the second differential output and generating a second op amp differential output;

a quantizer that converts the second op amp differential output to a binary bit to generate the differential feedback signal as an output of the chopper-stabilized sigma-delta modulator;

a first phase clock that is applied to the first phase switches and to the second phase switches;

a second phase clock that is applied to the first phase switches and to the second phase switches; and a clock generator that generates the first chopper clock and the second chopper clock as non-overlapping clocks having a second frequency, and that generates the first phase clock and the second phase clock as non-overlapping clocks having a first frequency that is a multiple of the second frequency, the clock generator generating edges of the first and second chopper clocks to occur before edges of the first phase clock and the second phase clock, when the first phase clock, the second phase clock, the first chopper clock, and the second chopper clock all change at a beginning of a chopper clock period, whereby chopper clock edges are generated before phase clock edges in the chopper clock period.

2. The chopper-stabilized sigma-delta modulator of claim 1 wherein the first chopper multiplier and the second chopper multiplier swap differential signals before the first phase switches in the first sample, hold, and integrate block switch states, and before the second phase switches in the second sample, hold, and integrate block switch states, wherein chopper multipliers are stable before phase switches change state.

3. The chopper-stabilized sigma-delta modulator of claim 2 wherein the clock generator further comprises:
a master clock operating at the first frequency;
a clock divider, receiving the master clock and dividing the master clock to generate a divided clock;
a first non-overlapping clock generator, receiving the master clock, that generates the first phase clock and the second phase clock wherein the first phase clock and the second phase clock are never active at a same time; and
a second non-overlapping clock generator, receiving the divided clock, that generates the first chopper clock and the second chopper clock wherein the first chopper clock and the second chopper clock are never active at a same time.

4. The chopper-stabilized sigma-delta modulator of claim 3 wherein the first non-overlapping clock generator further comprises:
an input delay that delays edges of the master clock to ensure that edges of the first phase clock and the second phase clock occur after edges of the first chopper clock and the second chopper clock are generated by the second non-overlapping clock generator.

5. The chopper-stabilized sigma-delta modulator of claim 2 wherein each differential signal, differential input, and differential output comprises a true line and a complement line; further comprising:
a first true integrating capacitor connected between true lines of the first op amp differential input and the first op amp differential output;
a first complement integrating capacitor connected between complement lines of the first op amp differential input and the first op amp differential output;
a second true integrating capacitor connected between true lines of the second differential output and the second op amp differential output; and
a second complement integrating capacitor connected between complement lines of the second differential output and the second op amp differential output.

6. The chopper-stabilized sigma-delta modulator of claim 5 wherein the first sample, hold, and integrate block further comprises:
a first true sampling capacitor;
a first complement sampling capacitor;
wherein the first true sampling capacitor is the first sampling capacitor;
a first true input phase switch that connects a true line of the analog input to a front terminal of the first true sampling capacitor when the first phase clock is active;
a first true fixed phase switch that applies a fixed voltage to a back terminal of the first true sampling capacitor when the first phase clock is active;
a first true feedback phase switch that connects a true line of the differential feedback signal to the front terminal of the first true sampling capacitor when the second phase clock is active;
a first true coupling phase switch that connects the back terminal of the first true sampling capacitor to a true line of the first differential output to the first chopper multiplier when the second phase clock is active;
a first complement input phase switch that connects a complement line of the analog input to a front terminal of the first complement sampling capacitor when the first phase clock is active;
a first complement fixed phase switch that applies the fixed voltage to a back terminal of the first complement sampling capacitor when the first phase clock is active;
a first complement feedback phase switch that connects a complement line of the differential feedback signal to the front terminal of the first complement sampling capacitor when the second phase clock is active; and
a first complement coupling phase switch that connects the back terminal of the first complement sampling capacitor to a complement line of the first differential output to the first chopper multiplier when the second phase clock is active.

7. The chopper-stabilized sigma-delta modulator of claim 6 wherein the second sample, hold, and integrate block further comprises:
a second true sampling capacitor;
a second complement sampling capacitor;
wherein the second true sampling capacitor is the second sampling capacitor;
a second true input phase switch that connects a true line of the intermediate differential signal to a front terminal of the second true sampling capacitor when the first phase clock is active;
a second true fixed phase switch that applies the fixed voltage to a back terminal of the second true sampling capacitor when the first phase clock is active;
a second true feedback phase switch that connects a true line of the differential feedback signal to the front terminal of the second true sampling capacitor when the second phase clock is active;
a second true coupling phase switch that connects the back terminal of the second true sampling capacitor to a true line of the second differential output to the second op amp when the second phase clock is active;
a second complement input phase switch that connects a complement line of the intermediate differential signal to a front terminal of the second complement sampling capacitor when the first phase clock is active;
a second complement fixed phase switch that applies the fixed voltage to a back terminal of the second complement sampling capacitor when the first phase clock is active;
a second complement feedback phase switch that connects a complement line of the differential feedback signal to the front terminal of the second complement sampling capacitor when the second phase clock is active; and
a second complement coupling phase switch that connects the back terminal of the second complement sampling capacitor to a complement line of the second differential output to the second op amp when the second phase clock is active.

8. The chopper-stabilized sigma-delta modulator of claim 6 wherein the first true input phase switch, the first true fixed phase switch, the first true feedback phase switch, the first true coupling phase switch, the first complement input phase switch, the first complement fixed phase switch, the first complement feedback phase switch, and the first complement coupling phase switch each comprise an n-channel transistor that receives the first phase clock or the second phase clock on a gate of the n-channel transistor.

9. An analog-to-digital converter (ADC) comprising:
a trigger clock;
a delay that delays the trigger clock to generate a delayed trigger clock;
a clock divider that divides the trigger clock to generate a divided clock having a divided-down frequency;
a multi-phase non-overlapping clock generator, receiving the delayed trigger clock that triggers generation of a first phase clock and a second phase clock that have non-overlapping active pulses and operate at a first frequency that is a multiple of the divided-down frequency;
a chopper non-overlapping clock generator, receiving the divided clock that triggers generation of a first chopper clock and a second chopper clock that have non-overlapping active pulses and operate at the divided-down frequency;
wherein the delayed trigger clock triggers the multi-phase non-overlapping clock generator to toggle the first phase clock and the second phase clock;
wherein the divided clock triggers the chopper non-overlapping clock generator to toggle the first chopper clock and the second chopper clock;
wherein edges of the first chopper clock and the second chopper clock occur earlier in a chopper clock period than edges of the first phase clock and the second phase clock that are triggered from a same edge of the trigger clock;
an analog signal;
a feedback signal
a first sampling capacitor having a front terminal and a back terminal;
an input transistor switch having a gate receiving the first phase clock, and a channel connecting the analog signal to the front terminal of the first sampling capacitor;
a feedback transistor switch having a gate receiving the second phase clock, and a channel connecting the feedback signal to the front terminal of the first sampling capacitor;
a coupling transistor switch having a gate receiving the second phase clock, and a channel connecting the back terminal of the first sampling capacitor to a first input signal;
a first op amp coupled between a first op amp input signal and a first op amp output signal, the first op amp having an inverting input and a non-inverting input that receive the first op amp input signal, and a first output and a second output that drive the first op amp output;
a first chopper pass-thru transistor switch, having a gate receiving the first chopper clock, and a channel that connects the first input signal to the inverting input of the first op amp;
a first chopper cross-over transistor switch, having a gate receiving the second chopper clock, and a channel that connects the first input signal to the non-inverting input of the first op amp;
a second chopper pass-thru transistor switch, having a gate receiving the first chopper clock, and a channel that connects the first output of the first op amp to an intermediate signal;
a second chopper cross-over transistor switch, having a gate receiving the second chopper clock, and a channel that connects the second output of the first op amp to the intermediate signal;
a first integrating capacitor connected between the intermediate signal and the first input signal; and
a quantizer that generates the feedback signal by quantizing a quantizer input signal.

10. The analog-to-digital converter (ADC) of claim 9 wherein the quantizer is a 1-bit digital-to-analog converter (DAC).

11. The analog-to-digital converter (ADC) of claim 9 wherein the intermediate signal is the quantizer input signal.

12. The analog-to-digital converter (ADC) of claim 9 further comprising:
a second sampling capacitor having a front terminal and a back terminal;
a second input transistor switch having a gate receiving the first phase clock, and a channel connecting the intermediate signal to the front terminal of the second sampling capacitor;
a second feedback transistor switch having a gate receiving the second phase clock, and a channel connecting the feedback signal to the front terminal of the second sampling capacitor;
a second coupling transistor switch having a gate receiving the second phase clock, and a channel connecting the back terminal of the second sampling capacitor to a second op amp input signal;
a second op amp coupled between the second op amp input signal and the quantizer input signal;
a second integrating capacitor connected between the second op amp input signal and the quantizer input signal.

13. A chopper sigma-delta modulator comprising:
clock generator means for generating a first chopper clock and a second chopper clock and a first phase clock and a second phase clock;
clock edge sequence means, in the clock generator means, for generating edges of the first chopper clock and the second chopper clock to occur before edges of the first phase clock and the second phase clock, when the first phase clock, the second phase clock, the first chopper clock, and the second chopper clock all change at a beginning of a chopper clock period;
wherein the chopper clock period is a multiple of a phase clock period;
phase non-overlapping means, in the clock generator means, for generating the first phase clock and the second phase clock as non-overlapping clocks with a same frequency, wherein the first phase clock and the second phase clock are not active at a same time;
an analog input;
a feedback output;
first sample, hold, and integrate means for sampling the analog input and for integrating with the feedback output to a first sampling capacitor that is switched by phase switches, wherein the analog input is sampled when the first phase clock is active, and the feedback output is applied to the first sampling capacitor when the second phase clock is active, and for connecting the first sampling capacitor to a first output when the second phase clock is active;
first amplifier means for amplifying a first amp input to generate a first amp output;
input chopper means, coupled between the first output and the first amp input, for connecting the first output to the first amp input when the first chopper clock is active, and for altering the first amp input when the second chopper clock is active;
output chopper means, coupled between the first amp output and an intermediate output, for connecting the first amp output to the intermediate output when the first chopper clock is active, and for altering the intermediate output when the second chopper clock is active;

first integrating capacitor means for capacitively coupling the intermediate output to the first output, and for bypassing the input chopper means, the first amplifier means, and the output chopper means;

wherein the intermediate output is a quantizer input for a first-order sigma-delta modulator;

quantizer means for converting the quantizer input to a binary bit to generate the feedback output, whereby chopper clock edges are generated before phase clock edges in the chopper clock period.

14. The chopper sigma-delta modulator of claim 13 wherein the chopper sigma-delta modulator is a second-order sigma-delta modulator, further comprising:

second sample, hold, and integrate means for sampling the intermediate output and for integrating with the feedback output to a second sampling capacitor that is switched by phase switches, wherein the intermediate output is sampled when the first phase clock is active, and the feedback output is applied to the second sampling capacitor when the second phase clock is active, and for connecting the second sampling capacitor to a second output when the second phase clock is active;

second amplifier means for amplifying the second output to generate the quantizer input; and second integrating capacitor means for capacitively coupling the second output to the quantizer input.

15. The chopper sigma-delta modulator of claim 14 wherein the input chopper means comprises:

input pass-through transistor switches, each receiving the first phase clock on a gate, for passing the first output through to the first amp input without alteration;

input cross-coupling transistor switches, each receiving the second phase clock on a gate, for swapping differential signals in the first output to drive the first amp input with alteration by differential swapping;

wherein the output chopper means comprises:

output pass-through transistor switches, each receiving the first phase clock on a gate, for passing the first amp output through to the intermediate output without alteration; and output cross-coupling transistor switches, each receiving the second phase clock on a gate, for swapping differential signals in the first amp output to drive the intermediate output with alteration by differential swapping.

16. The chopper sigma-delta modulator of claim 15 further comprising:

chopper non-overlapping means, in the clock generator means, for generating the first chopper clock and the second chopper clock as non-overlapping clocks with a same frequency, wherein the first chopper clock and the second chopper clock are not active at a same time.

17. The chopper sigma-delta modulator of claim 14 wherein the first sample, hold, and integrate means further comprises:

a first input phase switch that connects the analog input to a front terminal of the first sampling capacitor when the first phase clock is active;

a first feedback phase switch that connects the feedback output to the front terminal of the first sampling capacitor when the second phase clock is active; and a first coupling phase switch that connects the back terminal of the first sampling capacitor to the first output to the first chopper means when the second phase clock is active.

18. The chopper sigma-delta modulator of claim 17 wherein the first sample, hold, and integrate means further comprises:

a first fixed phase switch that applies a fixed voltage to a back terminal of the first sampling capacitor when the first phase clock is active.

19. The chopper sigma-delta modulator of claim 18 wherein the fixed voltage is a ground.

20. The chopper sigma-delta modulator of claim 17 wherein the first input phase switch comprises an n-channel transistor that receives the first phase clock on a gate;

wherein the first feedback phase switch and the first coupling phase switch each comprise an n-channel transistor that receives the second phase clock on a gate.

* * * * *

UNITED STATES PATENT AND TRADEMARK OFFICE
CERTIFICATE OF CORRECTION

| | | |
|---|---|---|
| PATENT NO. | : 8,471,744 B1 | Page 1 of 1 |
| APPLICATION NO. | : 13/308737 | |
| DATED | : June 25, 2013 | |
| INVENTOR(S) | : Wan et al. | |

It is certified that error appears in the above-identified patent and that said Letters Patent is hereby corrected as shown below:

In the Claims

Col. 8, Claim 1, line 23, change "second chopper clock," to --first chopper clock,--

Signed and Sealed this
Twenty-ninth Day of April, 2014

Michelle K. Lee
*Deputy Director of the United States Patent and Trademark Office*